United States Patent
Kim et al.

(10) Patent No.: US 10,651,401 B2
(45) Date of Patent: May 12, 2020

(54) METHOD FOR PREPARING LIGHT ABSORBER OF SOLAR CELL

(71) Applicant: LG CHEM, LTD., Seoul (KR)

(72) Inventors: Ji Hye Kim, Daejeon (KR); Sung-Ho Chun, Daejeon (KR); Jung Ha Park, Daejeon (KR); Chan Yeup Chung, Daejeon (KR); Tae Seob Lee, Daejeon (KR)

(73) Assignee: LG CHEM, LTD., Seoul (KR)

(*) Notice: Subject to any disclaimer, the term of this patent is extended or adjusted under 35 U.S.C. 154(b) by 74 days.

(21) Appl. No.: 15/750,983

(22) PCT Filed: Oct. 27, 2016

(86) PCT No.: PCT/KR2016/012182
§ 371 (c)(1),
(2) Date: Feb. 7, 2018

(87) PCT Pub. No.: WO2017/074069
PCT Pub. Date: May 4, 2017

(65) Prior Publication Data
US 2018/0226590 A1   Aug. 9, 2018

(30) Foreign Application Priority Data
Oct. 27, 2015 (KR) .................. 10-2015-0149471

(51) Int. Cl.
*H01L 51/00* (2006.01)
*C07F 7/24* (2006.01)
(Continued)

(52) U.S. Cl.
CPC ............ *H01L 51/0077* (2013.01); *C07F 7/24* (2013.01); *H01L 51/0007* (2013.01);
(Continued)

(58) Field of Classification Search
CPC ............ H01L 51/4226; H01L 51/0077; H01L 51/422; H01L 51/0007; H01L 51/0026;
(Continued)

(56) References Cited

U.S. PATENT DOCUMENTS 9,252,374 B2   2/2016 Seok et al.
2016/0086739 A1*  3/2016 Burschka .............. C07F 15/065
                                                    136/263

(Continued)

FOREIGN PATENT DOCUMENTS

EP    2 804 232 A1   11/2014
JP    2015-46582 A    1/2015
(Continued)

OTHER PUBLICATIONS

European Search Report for Appl. No. 16860252.2 dated Jul. 18, 2018.
Im et al., "Morphology-photovoltaic property correlation in perovskite solar cells: One-step versus two-step deposition of $CH_3NH_3PbI_3$," Apl Materials, vol. 2, Jul. 28, 2014, pp. 081510-1-081510-8 (9 pages total).
(Continued)

*Primary Examiner* — Caridad Everhart
(74) *Attorney, Agent, or Firm* — Birch, Stewart, Kolasch & Birch, LLP

(57) ABSTRACT

The present invention relates to a method for preparing a perovskite compound usable as a light absorber of a solar cell, and provides a method for preparing a light absorber of a solar cell in which the crystallinity of a perovskite compound is increased, resulting in an increase in the stability and efficiency of the solar cell.

9 Claims, 4 Drawing Sheets

(51) Int. Cl.
H01L 51/42 (2006.01)
H01L 31/0256 (2006.01)

(52) U.S. Cl.
CPC ...... H01L 51/0026 (2013.01); H01L 51/4226 (2013.01); *H01L 51/005* (2013.01); *H01L 51/006* (2013.01); *H01L 51/0056* (2013.01); *H01L 51/422* (2013.01); *H01L 2031/0344* (2013.01); *Y02E 10/549* (2013.01)

(58) Field of Classification Search
CPC ............ H01L 51/0005; H01L 51/5012; H01L 51/5088; H01L 51/0071; H01L 51/5016; H01L 51/0059; H01L 51/0061; C07F 7/24; C07F 7/23

See application file for complete search history.

(56) References Cited

U.S. PATENT DOCUMENTS

| 2016/0141111 | A1 | 5/2016 | Sato et al. | |
|---|---|---|---|---|
| 2016/0251303 | A1* | 9/2016 | Moore | B05D 3/007 428/220 |
| 2018/0151813 | A1* | 5/2018 | Zhu | H01L 51/0007 |
| 2018/0194786 | A1* | 7/2018 | Choi | C07F 7/24 |

FOREIGN PATENT DOCUMENTS

| KR | 10-2014-0007045 A | 1/2014 |
|---|---|---|
| KR | 10-1461634 B1 | 11/2014 |
| KR | 10-1462025 B1 | 11/2014 |
| KR | 10-2015-0047330 A | 5/2015 |
| WO | WO 2014/180789 A1 | 11/2014 |
| WO | WO 2015/001459 A1 | 1/2015 |
| WO | WO 2015/127494 A1 | 9/2015 |

OTHER PUBLICATIONS

Ahn et al., "Highly Reproducible Perovskite Solar Cells with Average Efficiency of 18.3% and Best Efficiency of 19.7% Fabricated via Lewis Base Adduct of Lead(II) Iodide", Journal of the American Chemical Society, Jun. 30, 2015, vol. 137, Issue 27, pp. 8696-8699.

Hao et al., "Controllable Perovskite Crystallization at a Gas-Solid Interface for Hole Conductor-Free Solar Cells with Steady Power Conversion Efficiency over 10%", Journal of the American Chemical Society, Nov. 6, 2014, vol. 136, Issue 46, pp. 16411-16419.

Hao et al., "Solvent-Mediated Crystallization of $CH_3NH_3SnI_3$ Films for Heterojunction Depleted Perovskite Solar Cells", Journal of the American Chemical Society, 2015, vol. 137, pp. 11445-11452.

Haruyama et al., "First-Principles Study of Ion Diffusion in Perovskite Solar Cell Sensitizers", Journal of the American Chemical Society, 2015, vol. 137, Issue 32, pp. 10048-10051.

International Search Report for PCT/KR2016/012182 dated Feb. 13, 2017.

Jung et al., "Perovskite Solar Cells: From Materials to Devices", Small, 2015, vol. 11, No. 1, pp. 10-25.

Kim et al., "Lead Iodide Perovskite Sensitized All-Solid-State Submicron Thin Film Mesoscopic Solar Cell with Efficiency Exceeding 9%", Scientific Reports, vol. 2, No. 591, 9 pgs.

Lv et al., "A promising alternative solvent of perovskite to induce rapid crystallization for high-efficiency photovoltaic devices", RSC Advances, 2015, vol. 5, pp. 20521-20529.

Wharf et al., "Synthesis and vibrational spectra of some lead (II) halide adducts with O-,S-, and N-donor atom ligands", Can. J. Chem., 1976, vol. 54, 9 pgs.

Yang et al., "High-performance photovoltaic perovskite layers fabricated through intramolecular exchange", Science, Jun. 12, 2015, vol. 348, Issue 6240, 5 pgs.

* cited by examiner

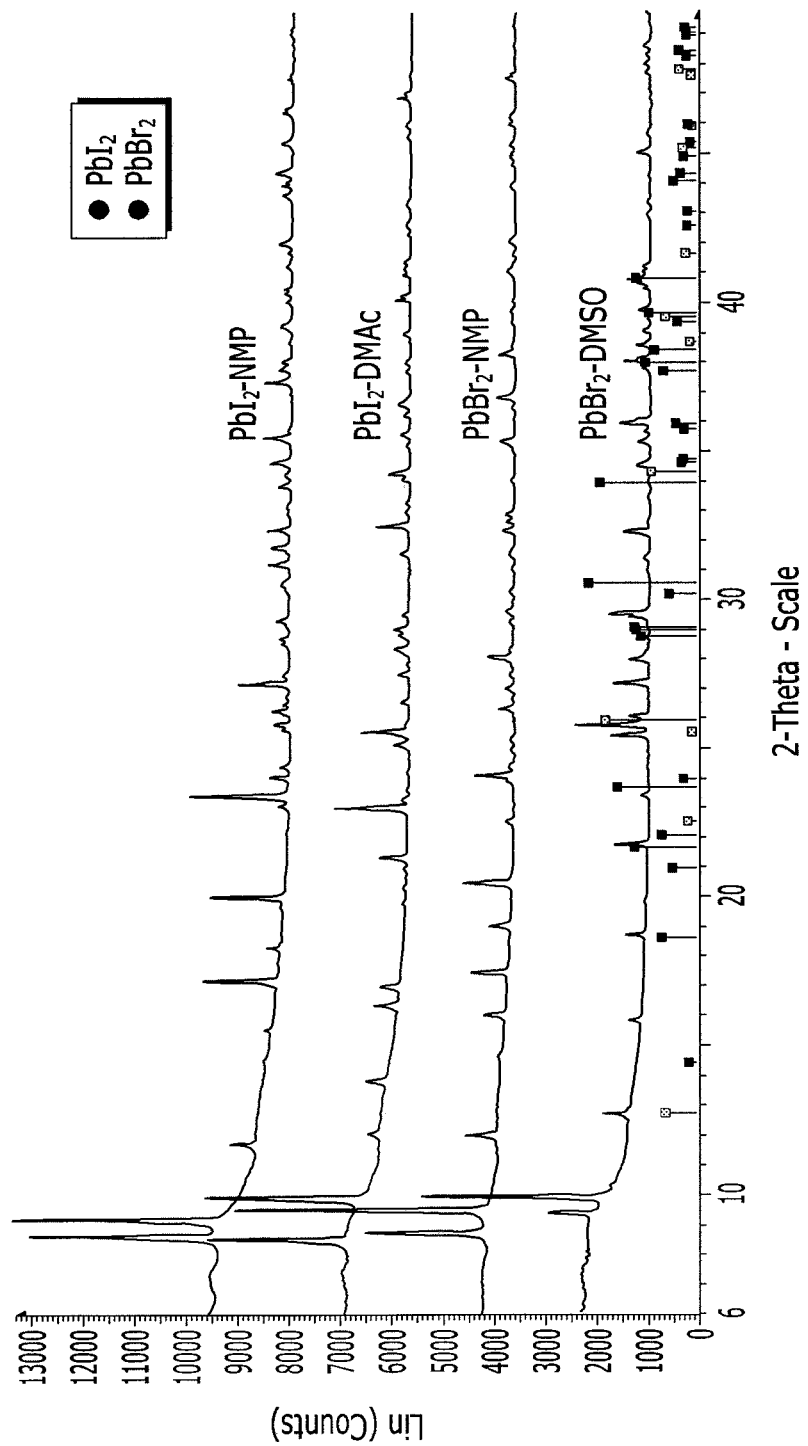
[Fig. 1]

[Fig. 2]
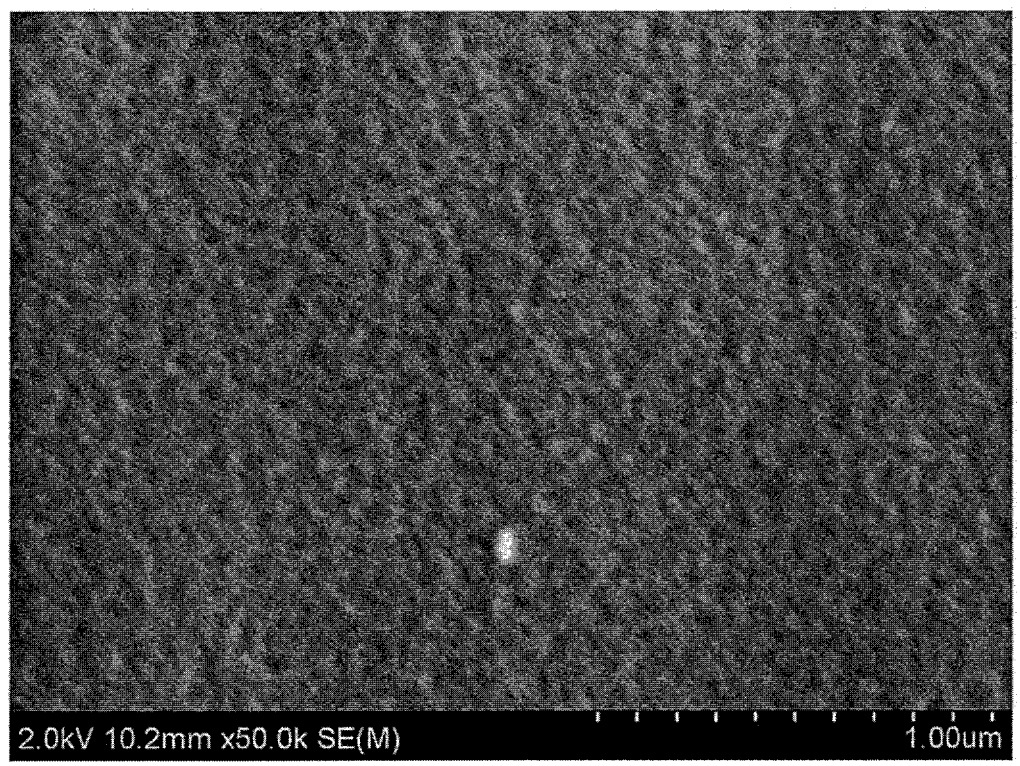

[Fig. 3]
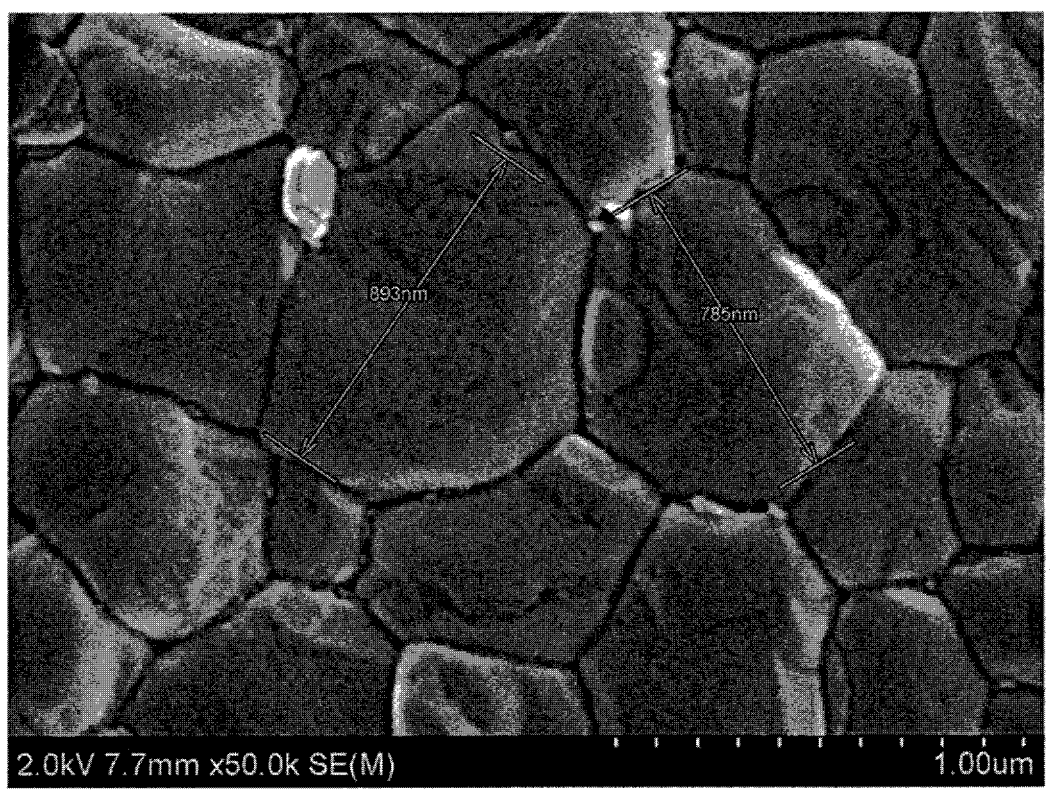

[Fig. 4]
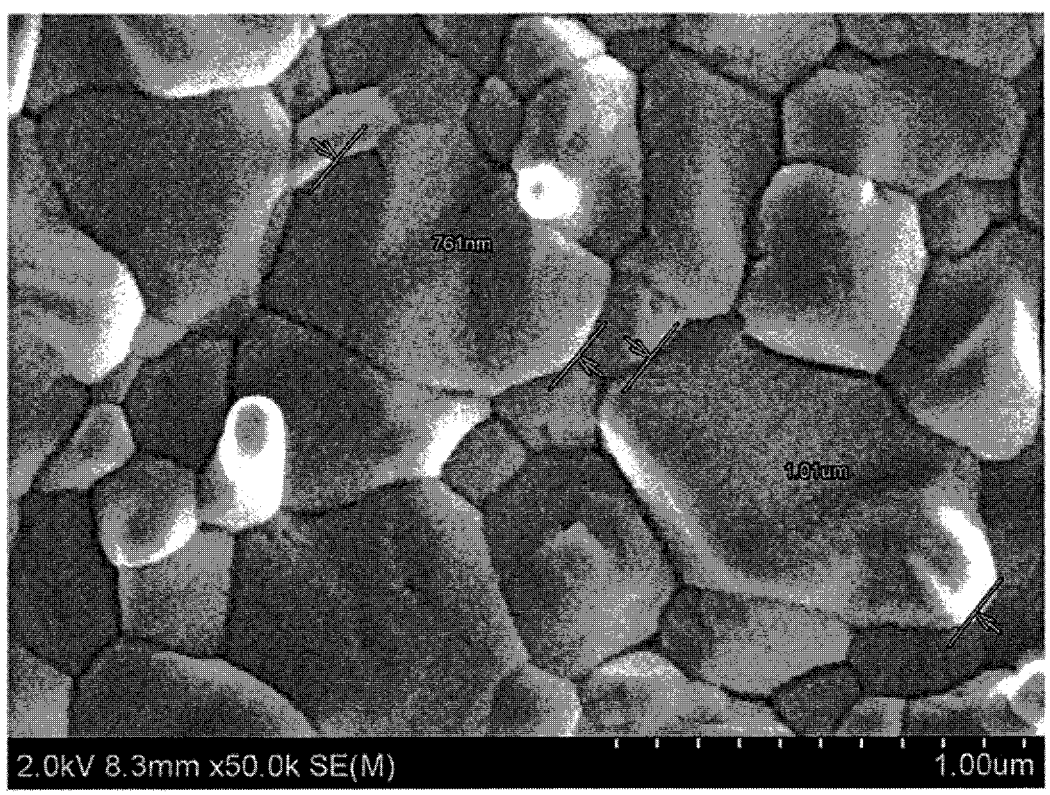

METHOD FOR PREPARING LIGHT ABSORBER OF SOLAR CELL

TECHNICAL FIELD

Cross-Reference to Related Application(S)

This application claims the benefit of priority based on Korean Patent Application No. 10-2015-0149471, filed Oct. 27, 2015 with the Korean Intellectual Property Office, the disclosure of which is incorporated herein by reference in its entirety.

The present invention relates to a method for preparing a perovskite compound usable as a light absorber of a solar cell.

BACKGROUND ART

In order to solve the depletion of fossil energy and global environmental problems caused by the use thereof, research into renewable and clean alternative energy sources such as solar energy, wind power, and water power has been actively conducted.

Of those, an interest in solar cells that can convert from solar light directly into electric energy has significantly increased. Here, the solar cell means a cell that absorbs light energy from solar light and generates a current-voltage by utilizing a photovoltaic effect from which electrons and holes are generated.

Various materials capable of absorbing light energy from solar light to form excitons have been reported. Recently, a perovskite-type compound has been spotlighted. Since it was reported (Scientific Reports 2, 591) that a perovskite-type compound generally has a formula of $AMX_3$ consisting of cations (A and M) and an anion (X) and $CH_3NH_3PbI_3$ may be used as an absorber of a solar cell, various compounds have been reported.

Such perovskite compound enables the change of the structure such as the substitution of cations and anions. Through the change of the band gap due to such structure, an absorber suitable for solar cells can be produced. In addition, recently, it has been reported that various electron transport layers and hole transport layers may be used together with a perovskite compound to increase the efficiency of solar cells.

However, the perovskite compound has some limitations in using the same as an absorber of a solar cell. First, the perovskite compound is sensitive to moisture and has problems such as decomposition upon exposure to moisture, thereby causing a disadvantage that it has a poor long-term stability when applied to solar cells. In order to solve this disadvantage, studies have been conducted for substituting the constituent elements of the perovskite compound, but the compounds, which are useful as an absorber of a solar cell while being highly stable against moisture, are significantly limited.

In addition, the perovskite compound has a specific crystal, in which defects tend to occur depending on the preparation conditions. Due to such defects, there is a problem that the efficiency of solar cells is decreased.

Various reactants have been studied to suppress the formation of defects, and recently, an example has been reported in which a DMSO adduct ($PbI_2$-DMSO) is used as a perovskite precursor (Science 2015, Vol. 348, no. 6240, pp 1234-1237). However, the DMSO adduct ($PbI_2$-DMSO) is present as $PbI_2$-DMSO and $PbI_2$-$DMSO_2$, which causes a problem that the stability of the substance itself is decreased and it is difficult to synthesize the same.

The present inventors have made extensive and intensive studies about a method for preparing a light absorber of a solar cell in which the crystallinity of a perovskite compound is increased, resulting in an increase in the stability and efficiency of the solar cell, and found that the above problems can be solved by the preparation method as described below, thereby completing the present invention.

DETAILED DESCRIPTION OF THE INVENTION

Technical Problem

The present invention relates to a method for preparing a perovskite compound usable as a light absorber of a solar cell. An object of the present invention is to provide a method for preparing a light absorber of a solar cell, wherein the crystallinity of a perovskite compound is increased to allow solar cells to have increased stability and efficiency.

Technical Solution

In order to achieve the above object, the present invention provides a method for preparing a light absorber of a solar cell, comprising the steps of: applying, on an electrode, (a) an adduct of i) a compound represented by Chemical Formula 1, and ii) a polar aprotic solvent containing a NH or $NCH_3$ structure, and (b) a solution containing one or two types of compounds represented by Chemical Formula 2 (step 1); and heat-treating the electrode of step 1 (step 2):

$$MXX' \qquad \text{[Chemical Formula 1]}$$

in Chemical Formula 1,
M is a divalent metal cation,
X and X' are each independently the same or different halogen;

$$AX'' \qquad \text{[Chemical Formula 2]}$$

in Chemical Formula 2,
A is an organic cation of $R_1R_2R_3R_4N^+$, or $(R_5R_6N=CH-NR_7R_8)^+$,
wherein $R_1$, $R_2$, $R_3$ and $R_4$ are each independently hydrogen, or $C_{1-10}$ alkyl, with the proviso that at least one of $R_1$, $R_2$, $R_3$ and $R_4$ is $C_{1-10}$ alkyl,
$R_5$, $R_6$, $R_7$ and $R_8$ are each independently hydrogen, or $C_{1-10}$ alkyl, and
X'' is halogen.

The light absorber of a solar cell to be prepared in the present invention is a perovskite compound. As used herein, the term "perovskite" is named after the Russian mineralogist, Lev Perovski, and refers to any material having a formula of $AMX_3$ consisting of cations (A and M) and an anion (X), and having the same type of structure as calcium titanium oxide ($CaTiO_3$), the first perovskite type material, which was discovered in the Ural mountains.

A general method for preparing a perovskite compound ($AMX_3$) includes a step of reacting an AM compound with an $MX_2$ compound to produce a perovskite crystal. However, depending on reaction conditions, defects may occur when the crystal is formed, and this is one reason why the efficiency of solar cells is decreased.

In order to prepare a perovskite compound with low defects, that is, high crystallinity, an arrangement between the reaction materials should be made well in order to form a crystal structure during reaction between an AM compound and an $MX_2$ compound. In this context, the present invention has a feature that as a reaction material corresponding to $MX_2$, its adduct with N-methylpyrrolidone or dimethylacetamide is used, and this is utilized to prepare a perovskite compound with high crystallinity.

The present invention will be described below in detail for each step.

Step of Applying, on an Electrode, an Adduct of i) a Compound Represented by Formula 1, and ii) a Polar Aprotic Solvent Containing a NH or $NCH_3$ Structure, and (b) a Solution Containing One or Two Types of Compounds Represented by Formula 2 (Step 1)

For the compound represented by Formula 1 used for preparing a light absorber of a solar cell, it is used as an adduct in the present invention.

As used herein, the term "adduct" refers to a single reactant formed by adding two or more distinct molecules to each other. In the present invention, it refers to a compound having a structure in which a polar aprotic solvent containing a NH or $NCH_3$ structure is added to a compound of MXX'.

In the case of using the above-mentioned adduct, although not theoretically limited, when reacting with the AX" compound of Formula 2, the polar aprotic solvent mediates the reactants to induce a perovskite crystal structure. Then, the perovskite crystal structure is formed while the polar aprotic solvent being removed, so that defect formation can be suppressed, resulting in an increase in the crystallinity of the perovskite compound.

Therefore, the material forming an adduct in the present invention should have properties such that it reacts with the compound represented by Formula 1 to effectively form an adduct, and is also removed well when reacting with the compound represented by Formula 2. In this context, since the polar aprotic solvent used in the present invention includes a NH or $NCH_3$ structure to thereby exhibit an appropriate polarizability, it may effectively form an adduct before reacting with the compound represented by Formula 2, and due to its weak bonding strength with the metal element (M) of the compound represented by Formula 1, it may be effectively removed when reacting with the compound represented by Formula 2. In addition, since the polar aprotic solvent has a large molecular volume, when it forms an adduct, it makes a wide gap between the compounds represented by Formula 1, thereby allowing easy substitution by the compound represented by Formula 2.

The adduct may be prepared by a method commonly used in the art. In addition, generally, several adducts may be prepared in the process of preparing an adduct. However, the adduct used in the present invention has a feature that since it is present as a single substance or no mutual change occurs, the stability of the substance itself is high.

Preferably, the polar aprotic solvent is N,N-dimethylacetamide, N-methylpyrrolidone, N-methyl-2-pyridone, N,N-dimethylformamide, piperidine, or aniline.

Preferably, in Formula 1, M is $Pb^{2+}$, $Sn^{2+}$, $Pd^{2+}$, $Cu^{2+}$, $Ge^{2+}$, $Sr^{2+}$, $Cd^{2+}$, $Ca^{2+}$, $Ni^{2+}$, $Mn^{2+}$, $Fe^{2+}$, $Co^{2+}$, $Sn^{2+}$, $Yb^{2+}$, or $Eu^{2+}$.

Also preferably, X and X' are each independently $Cl^-$, $Br^-$, or $I^-$. Since X, and X' may be different from each other, the compound represented by Chemical Formula 1 may include two types of halogens.

Preferably, the adduct is $PbCl_2$(N,N-dimethylacetamide), $PbBr_2$(N,N-dimethylacetamide), $PbI_2$(N,N-dimethylacetamide), $PbBr_2$(N-methylpyrrolidone), $PbI_2$(N-methylpyrrolidone), $PbCl_2$(N-methyl-2-pyridone)$_2$, $PbI_2$(N-methyl-2-pyridone)$_2$, $PbI_2$(piperidine), $PbCl_2$(aniline), or $PbI_2$(aniline).

Preferably, in Chemical Formula 2, A is $CH_3NH_3^+$, or $(H_2N=CH-NH_2)^+$.

Also preferably, X" is $Cl^-$, $Br^-$, or $I^-$.

Representative examples of the compound represented by Chemical Formula 2 include $CH_3NH_3I$, $CH_3NH_3Br$, $(H_2N=CH-NH_2)I$ and $(H_2N=CH-NH_2)Br$.

Moreover, one or two types of compounds represented by Chemical Formula 2 may be used. When two types thereof are used, a perovskite compound containing two types of organic cations may be prepared.

Preferably, two types of compounds represented by Chemical Formula 2 are used, wherein each A of the two types of compounds is preferably $CH_3NH_3^+$, or $(H_2N=CH-NH_2)^+$.

The method of applying the solution is not particularly limited, and for example, spin-coating, dip coating, screen coating, spray coating, electrospinning, or the like may be used. In this case, the application of the solution may be performed for 10 seconds to 10 minutes. In addition, the application of the solution is preferably performed at 25 to 70° C.

Further, the solvent for the above solution is not particularly limited as long as it is a solvent capable of dissolving the adduct and the compound represented by Formula 2, and may be preferably N,N-dimethylformamide, N-methylpyrrolidone, N, N-dimethylacetamide, gamma-butyrolactone, dimethylsulfoxide and the like.

Preferably, the molar ratio of the adduct and the compound represented by Formula 2 is 1:0.8 to 1:1.5. A perovskite crystal may be effectively produced in the above range.

Meanwhile, the electrode is not particularly limited as long as it is an electrode usable for solar cells. For example, fluorine doped tin oxide (FTO), indium doped tin oxide (ITO), ZnO, PEDOT:PSS and the like may be used.

Further, a porous metal oxide may be formed on the electrode. The porous metal oxide is not only capable of widening the area where a light absorber can absorb light but also of serving as an electron transport layer which can transport electrons generated in the light absorber. As the metal oxide, $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO may be used.

The porous metal oxide may be formed by applying and drying a slurry containing metal oxide particles, and then subjecting it to heat treatment. The porous metal oxide may have an average particle size of 5 to 500 nm and the porous metal oxide layer may have a thickness of 50 nm to 10 μm.

Meanwhile, the step 1 may be performed by sequentially applying, on an electrode, a first solution containing the adduct and a second solution containing the compound represented by Chemical Formula 2. At this time, the solvents in the first solution and the second solution are as described above in step 1, and the same or different solvents may be used.

Furthermore, when the first solution and the second solution are sequentially applied as described above, a step of applying a non-solvent after the application of the first solution, may be further included.

Examples of the usable non-solvent may include isopropanol, methyl ethyl ketone, ethyl acetate, acetic acid, dimethyl ether, chlorobenzene, toluene, xylene, hexene, cyclohexene or chloroform. The method of applying the non-solvent is not particularly limited, and for example, spin-coating, dip coating, screen coating, spray coating, electrospinning, or the like may be used. In this case, the application of the solution may be performed for 10 seconds to 10 minutes. In addition, the application of the non-solvent is preferably performed at room temperature.

Heat-Treating the Electrode of the Step 1 (Step 2)

Step 2 is a step of reacting and fixing the perovskite precursor compound applied in the step 1 to prepare a perovskite light absorber.

The heat treatment is preferably performed at 30 to 200° C., more preferably at 150° C. In addition, the heat treatment is preferably performed for 1 minute to 60 minutes, more preferably for 30 minutes.

Meanwhile, after the step 2, a step of forming a hole transport layer and an electrode may be further included to form the configuration of solar cells generally used in the art.

The electron transport layer may use a porous metal oxide, and preferably has a porous structure by metal oxide particles. As the metal oxide, $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO may be used.

The hole transport layer may use a solid-state hole transport material or a liquid-phase electrolyte. As an example of the solid-state hole transport material, spiro-OMeTAD(2,2',7,7'-tetrakis-(N, N-di-p-methoxyphenylamine)9,9'-spirobifluorene), P3HT(poly(3-hexylthiophene)), PCPDTBT(poly[2,1,3-benzothiadiazole-4, 7-diyl[4,4-bis(2-ethylhexyl)-4H-cyclopenta[2,1-b:3,4-b']dithiopen-2,6-diyl]]), PVK(poly(N-vinylcarbazole)), HTM-TFSI(1-hexyl-3-methylimidazolium bis(trifluoromethylsulfonyl)imide), Li-TFSI(lithium bis(trifluoromethanesulfonyl)imide), tBP (tert-butylpyridine), PDOT: PSS (poly(3,4-ethylenedioxythiophene) poly(styrenesulfonate)), or the like may be used. As the liquid-phase electrolyte, the one in which iodine and an additive have been dissolved in a solvent may be used. For example, one or more additives selected from the group consisting of urea, thiourea, tert-butylpyridine, guanidium thiocyanate, and the like may be used together with one or more solvents selected from the group consisting of ethyl acetate, acetonitrile, toluene, methoxypropionitrile, and the like.

As for the second electrode, a conductive layer containing one or more materials selected from the group consisting of Pt, Au, Ni, Cu, Ag, In, Ru, Pd, Rh, Ir, Os, C, and a conductive polymer may be formed on a glass substrate or a plastic substrate containing one or more materials selected from the group consisting of ITO, FTO, ZnO—$Ga_2O_3$ and tin-based oxide.

Light Absorber of Solar Cell

The light absorber of a solar cell prepared according to the present invention is prepared by using an adduct so that a perovskite crystal substantially free of defects and with high crystallinity can be prepared.

According to an embodiment of the present invention, it has been found that the light absorber of a solar cell prepared by using the adduct of the present invention has high crystallinity and high efficiency in solar cells, and thus can be effectively used as a light absorber of a solar cell.

Meanwhile, solar cells to which the light absorber of a solar cell prepared according to the present invention is applicable may include the configuration of solar cells used in the art, except that the above light absorber is used.

Advantageous Effects

The method of preparing a light absorber of a solar cell according to the present invention has a feature that the crystallinity of a perovskite compound usable as a light absorber of a solar cell is increased, resulting in an increase in the stability and efficiency of the solar cell.

BRIEF DESCRIPTION OF THE DRAWINGS

FIG. 1 shows a XRD graph for the adducts used in Examples and Comparative Examples of the present invention.

FIG. 2 shows a SEM image for the surface of a substrate after the adduct has been coated on the substrate in Examples of the present invention.

FIG. 3 is a SEM image for the surface of the light absorber prepared in Examples of the present invention.

FIG. 4 is a SEM image for the surface of the light absorber prepared in Examples of the present invention.

DETAILED DESCRIPTION OF THE EMBODIMENTS

Below, preferred examples will be described in order to better understand the present invention. However, these examples are provided for easier understanding of the invention only, and should not be construed as limiting the scope of the present invention thereto.

Preparative Example 1: Preparation of $PbI_2$-NMP Adduct

N-methylpyrrolidone (NMP) was added to $PbI_2$ in an amount of 15-fold molar equivalent relative to $PbI_2$, and the mixture was stirred at 60° C. After confirming that $PbI_2$ was all dissolved, toluene was added dropwise slowly with stirring in an amount of 1.5-fold relative to the volume of NMP. The resulting white solid was filtered and dried in a vacuum oven for 30 minutes to give a $PbI_2$-NMP adduct. This adduct was analyzed by XRD and NMR, and the results are shown in FIG. 1 and in the following, respectively.

$^1$H NMR (DMSO-$d_6$, standard TMS): δ 3.32 (2H, t), 2.69 (3H, s), 2.19 (2H, t), 1.99 (2H, m)

Preparative Example 2: Preparation of $PbI_2$-DMAc Adduct

Dimethylacetamide (DMAc) was added to $PbI_2$ in an amount of 30-fold molar equivalent relative to $PbI_2$, and the mixture was stirred at 60° C. After confirming that $PbI_2$ was all dissolved, toluene was added dropwise slowly with stirring in an amount of 1.5-fold relative to the volume of DMAc. The resulting white solid was filtered and dried in a vacuum oven for 30 minutes to give a $PbI_2$-DMAc adduct. This adduct was analyzed by XRD and NMR, and the results are shown in FIG. 1 and in the following, respectively.

$^1$H NMR (DMSO-$d_6$, standard TMS): δ 2.97 (3H, t), 2.83 (3H, s), 1.95 (3H, s)

Preparative Example 3: Preparation of $PbBr_2$—NMP Adduct

N-methylpyrrolidone (NMP) was added to $PbBr_2$ in an amount of 20-fold molar equivalent relative to $PbBr_2$, and the mixture was stirred at 60° C. After confirming that $PbBr_2$ was all dissolved, toluene was added dropwise slowly with stirring in an amount of 1.5-fold relative to the volume of NMP. The resulting white solid was filtered and dried in a vacuum oven for 30 minutes to give a $PbBr_2$—NMP adduct. This adduct was analyzed by XRD and NMR, and the results are shown in FIG. 1 and in the following, respectively.

$^1$H NMR (DMSO-d$_6$, standard TMS): δ 3.30 (2H, t), 2.71 (3H, s), 2.20 (2H, t), 1.97 (2H, m)

Preparative Example 4: Preparation of PbI$_2$-DMSO Adduct

Dimethylsulfoxide (DMSO) was added to PbI$_2$ in an amount of 15-fold molar equivalent relative to PbI$_2$, and the mixture was stirred at 60° C. After confirming that PbI$_2$ was all dissolved, toluene was added dropwise slowly with stirring in an amount of 2-fold relative to the volume of DMSO. The resulting white solid was filtered and dried in a vacuum oven for 45 hours to give a PbI$_2$-DMSO adduct. This adduct was analyzed by XRD, and the results are shown in FIG. 1.

Example 1: Preparation of Light Absorber (Step 1)
The FTO substrate having a size of 25 mm×25 mm was etched on its end portions to partially remove FTO. 0.1 M solution of [(CH$_3$)$_2$CHO]$_2$Ti(C$_5$H$_7$O$_2$)$_2$ (titanium diisopropoxide bis(acetylacetonate)) 1-butanol was coated on the FTO substrate by air spray over four times in total, and sintered at 500° C. for 25 minutes to prepare a TiO$_2$ dense film with a thickness of about 70 nm. Then, a dispersion solution containing 1.5 g of a TiO$_2$ paste having a size (diameter) of 40 nm on average and 10 mL of ethanol was spin-coated on the dense film at 5000 rpm for 60 seconds. After subjecting it to heat treatment at 125° C. on a hot plate, sintering was performed at 500° C. for 1 hour using a muffle furnace.

(Step 2)
The compound prepared in Preparation Example 1 was dissolved in dimethylformamide (DMF) at 65° C. to prepare a 1.8 M solution. The solution was spin-coated on the substrate prepared in above step 1 at 3000 rpm for 30 seconds.

(Step 3)
As soon as the spin-coating of above step 2 was completed, an 800 mM FAI$_{(1-x)}$MABr$_{(x)}$ (x=0.3) solution (in isopropanol) was sprayed thereon, then coated at 5000 rpm for 30 seconds, and heat-treated at 150° C. for 20 minutes. Then, after washing with isopropanol for 20 seconds, the solvent was removed at 5000 rpm for 30 seconds and heat-treated at 80° C. for 3 minutes.

Example 2: Preparation of Light Absorber

A light absorber was prepared in the same manner as in Example 1, except that in step 2 of Example 1, a 1.6 M solution obtained by dissolving the compound prepared in Preparation Example 2 in dimethylformamide (DMF) was used.

Example 3: Preparation of Light Absorber (Step 1)
The FTO substrate having a size of 25 mm×25 mm was etched on its end portions to partially remove FTO. A 0.1 M solution of [(CH$_3$)$_2$CHO]$_2$Ti(C$_5$H$_7$O$_2$)$_2$ (titanium diisopropoxide bis(acetylacetonate)) 1-butanol was coated on the FTO substrate by air spray over four times in total, and sintered at 500° C. for 25 minutes to prepare a TiO$_2$ dense film with a thickness of about 70 nm. Then, a dispersion solution containing 1.5 g of a TiO$_2$ paste having a size (diameter) of 40 nm on average and 10 mL of ethanol was spin-coated on the dense film at 5000 rpm for 60 seconds. After heat-treatment at 125° C. on a hot plate, sintering was performed at 500° C. for 1 hour using a muffle furnace.

(Step 2)
The compound prepared in Preparative Example 1 and the compound prepared in Preparative Example 3 in a molar ratio of 85:15, and FAI and MABr in a molar ratio of 85:15, were dissolved in DMF to prepare a total of 60% by weight solution. The solution was spin-coated on the substrate prepared in above step 1 at 500 rpm for 5 seconds, 1000 rpm for 40 seconds, 5000 rpm for 50 seconds, and 1 mL of toluene was dropped 5 seconds before the end. Then, the substrate was heat-treated at 150° C. for 20 minutes.

Example 4

A light absorber was prepared in the same manner as in Example 3, except that in step 2 of Example 3, a solution of GBL:DMSO=7:3 (a total of 60% by weight) in which the compound prepared in Preparation Example 1 and 1 molar equivalent of MAI had been dissolved was used.

Comparative Example 1

A light absorber was prepared in the same manner as in Example 1, except that in step 2 of Example 1, a 1.6 M solution obtained by dissolving PbI$_2$ in dimethylformamide (DMF) at 65° C. was used.

Comparative Example 2: Preparation of Light Absorber

A light absorber was prepared in the same manner as in Example 1, except that in step 2 of Example 1, a 1.6 M solution obtained by dissolving the compound prepared in Preparation Example 4 in dimethylformamide (DMF) at 65° C. was used.

Experimental Example 1: Observation of Surface of Light Absorber

The surface of the substrate prepared in steps 2 and 3 of Example 1 was observed and the results are shown in FIG. 2 and FIG. 3, respectively. In addition, the surface of the substrate prepared in Example 2 was observed and the results are shown in FIG. 4.

Experimental Example 2: Performance Evaluation of Solar Cell

LiTFSi (17.5 uL) and tBP (28.8 uL) were added to 1 mL of a 58 mM Spiro-OMeTAD solution (in chlorobenzene). The solution was spin-coated on each of the light absorbers prepared in the Examples and Comparative Examples at 6000 rpm for 30 seconds to prepare hole transport layers. Au was vacuum-deposited on the hole transport layers using a thermal evaporator to produce solar cells.

For the solar cells thus produced, their performance was measured with Solar system (Newport). The results are shown in Table 1 below.

TABLE 1

|  | Short circuit current density (mA/cm$^2$) | Open voltage (V) | Performance index (%) | Power generation efficiency (%) |
|---|---|---|---|---|
| Example 1 | 24.24 | 1.102 | 0.75 | 20.10 |
| Example 2 | 21.99 | 1.041 | 0.61 | 14.01 |
| Example 3 | 23.98 | 1.073 | 0.67 | 17.25 |
| Example 4 | 23.05 | 1.061 | 0.74 | 18.15 |
| Comparative Example 1 | 18.65 | 1.080 | 0.73 | 14.70 |
| Comparative Example 2 | 24.28 | 1.067 | 0.75 | 19.50 |

The invention claimed is:

1. A method for preparing a light absorber of a solar cell, comprising the steps of:

applying, on an electrode (step 1), step 1(a) coating an adduct of i) a compound represented by Chemical Formula 1, and ii) a polar aprotic solvent containing a NH or NCH$_3$ structure in a solvent different from the polar aprotic solvent in the adduct, and step 1(b) coating a solution containing one or two types of compounds represented by Chemical Formula 2, wherein step 1(a) and step 1(b) are preformed sequentially; and heat-treating the electrode of step 1 (step 2):

MXX'  [Chemical Formula 1]

in Chemical Formula 1,

M is a divalent metal cation,

X and X' are each independently the same or different halogen;

AX"  [Chemical Formula 2]

in Chemical Formula 2,

A is an organic cation of $R_1R_2R_3R_4N^+$, or $(R_5R_6N=CH-NR_7R_8)^+$, wherein $R_1$, $R_2$, $R_3$ and $R_4$ are each independently hydrogen, or $Cl_{1-10}$ alkyl, with the proviso that at least one of $R_1$, $R_2$, $R_3$ and $R_4$ is $C_{1-10}$ alkyl, $R_5$, $R_6$, $R_7$ and $R_8$ are each independently hydrogen, or $C_{1-10}$ alkyl, and X" is halogen.

2. The method according to claim 1, wherein the polar aprotic solvent is N,N-dimethylacetamide, N-methylpyrrolidone, N-methyl-2-pyridone, N,N-dimethylformamide, piperidine, or aniline.

3. The method according to claim 1, wherein the adduct is PbCl$_2$(N,N-dimethylacetamide), PbBr$_2$(N,N-dimethylacetamide), PbI$_2$(N,N-dimethylacetamide), PbBr$_2$(N-methylpyrrolidone), PbI$_2$(N-methylpyrrolidone), PbCl$_2$(N-methyl-2-pyridone)$_2$, PbI$_2$(N-methyl-2-pyridone)$_2$, PbI$_2$(piperidine), PbCl$_2$(aniline), or PbI$_2$(aniline).

4. The method according to claim 1, wherein the solvent of step 1 is N,N-dimethylformamide, N-methylpyrrolidone, N,N-dimethylacetamide, gamma-butyrolactone, or dimethylsulfoxide.

5. The method according to claim 1, wherein M is Pb$^{2+}$, Sn$^{2+}$, Pd$^{2+}$, Cu$^{2+}$, Ge$^{2+}$, Sr$^{2+}$, Cd$^{2+}$, Ca$^{2+}$, Ni$^{2+}$, Mn$^{2+}$, Fe$^{2+}$, Co$^{2+}$, Sn$^{2+}$, Yb$^{2+}$, or Eu$^{2+}$.

6. The method according to claim 1, wherein X, X' and X" are each independently Cl$^-$, Br$^-$, or I$^-$.

7. The method according to claim 1, wherein A is CH$_3$NH$_3^+$, or (H$_2$N=CH—NH$_2$)$^+$.

8. The method according to claim 1, wherein the heat treatment of step 2 is performed at 30 to 200° C. for 1 minute to 60 minutes.

9. A solar cell comprising a light absorber of a solar cell prepared by the method of claim 1.

* * * * *